(12) United States Patent
Wang et al.

(10) Patent No.: US 8,729,669 B2
(45) Date of Patent: May 20, 2014

(54) BIPOLAR TRANSISTOR AND METHOD FOR MANUFACTURING THE SAME

(75) Inventors: Le Wang, Wuxi New District (CN); Linchun Gui, Wuxi New District (CN); Kongwei Zhu, Wuxi New District (CN); Zhiyong Zhao, Wuxi New District (CN)

(73) Assignees: CSMC Technologies FAB1 Co., Ltd., Wuxi New District (CN); CSMC Technologies FAB2 Co., Ltd., Wuxi New District (CN)

( * ) Notice: Subject to any disclaimer, the term of this patent is extended or adjusted under 35 U.S.C. 154(b) by 212 days.

(21) Appl. No.: 13/519,252

(22) PCT Filed: Dec. 2, 2010

(86) PCT No.: PCT/CN2010/079392
§ 371 (c)(1),
(2), (4) Date: Jun. 26, 2012

(87) PCT Pub. No.: WO2011/066800
PCT Pub. Date: Jun. 9, 2011

(65) Prior Publication Data
US 2013/0001747 A1    Jan. 3, 2013

(30) Foreign Application Priority Data
Dec. 4, 2009    (CN) .......................... 2009 1 0252939

(51) Int. Cl.
H01L 29/02    (2006.01)
(52) U.S. Cl.
USPC .......................................... 257/593; 438/205
(58) Field of Classification Search
USPC ....................................................... 257/593
See application file for complete search history.

(56) References Cited

U.S. PATENT DOCUMENTS 6,211,028 B1    4/2001    Tsai et al.
2003/0219952 A1    11/2003    Fujimaki

FOREIGN PATENT DOCUMENTS

| CN | 1398432 | 2/2003 |
|---|---|---|
| DE | 19742624 | 4/1999 |
| JP | 2000-114190 | 4/2000 |

*Primary Examiner* — Anthony Ho
(74) *Attorney, Agent, or Firm* — Hamre, Schumann, Mueller & Larson, P.C.

(57) ABSTRACT

A method for manufacturing a bipolar transistor includes forming a first epitaxial layer on a semiconductor substrate, forming a second epitaxial layer on the first epitaxial layer, forming an oxide layer on the second epitaxial layer, etching the oxide layer to form an opening in which the second epitaxial layer is exposed, and forming a third epitaxial layer in the opening. The first and third epitaxial layers have a first-type conductivity, and the second epitaxial layer has a second-type conductivity.

22 Claims, 3 Drawing Sheets

BIPOLAR TRANSISTOR AND METHOD FOR MANUFACTURING THE SAME

TECHNOLOGY FIELD

The present disclosure relates to a semiconductor device and, more particularly, to a bipolar transistor and a method for manufacturing a bipolar transistor.

BACKGROUND

A bipolar transistor is one type of device constituting a modern large-scale integrated circuit. Due to their high operating speed, large output current density, and small variation of turn-on voltage, bipolar transistors are suitable for analog circuits.

Performance requirements for semiconductor devices have increased with the steady development of semiconductor processes. Generally, in a traditional process for manufacturing a bipolar transistor (e.g., a vertical NPN transistor), an effective width of a base may be controlled by a two-step base/emitter thermal process. First, boron ions are implanted and diffused in a substrate to form a base region. Then phosphor ions are implanted and diffused in the base region to form an emitter region. The depth difference between a bottom of the base region and a bottom of the emitter region defines a width of the base.

FIGS. 1-3 illustrate a conventional process for manufacturing a vertical NPN transistor. As shown in FIG. 1, a semiconductor substrate 100 is provided. Suitable material for semiconductor substrate 100 may be, for example, silicon or silicon germanium. Antimony ions are then implanted and diffused in the semiconductor substrate 100 to form an N-type buried layer 101. Then, an N-type epitaxial layer 102 is formed on the N-type buried layer 101 using an epitaxial method.

A first photoresist layer (not shown) is then formed on the N-type epitaxial layer 102 and patterned by a photolithography process to define an opening in the first photoresist layer. Using the patterned first photoresist layer as an implantation mask, P-type ions are implanted and diffused in the N-type epitaxial layer 102 to form a base region 104 below the opening in the first photoresist layer. The P-type ions may be, for example, boron ions. After forming the base region 104, the first photoresist layer is removed, as shown in FIG. 2.

Referring to FIG. 3, a second photoresist layer (not shown) is formed on the N-type epitaxial layer 102. The second photoresist layer is patterned by a photolithography process to define an opening in the second photoresist layer. Using the patterned second photoresist layer as an implantation mask, N-type ions are implanted and diffused in the base region 104, so as to form an emitter 106. The remaining portion of the base region 104 not converted into P-type serves as the base of the transistor. The depth of the base region 104 is larger than that of the emitter 106.

Since the emitter in an NPN transistor formed by the conventional process is surrounded by the base, an edge-crowding effect of emitter current may occur. This effect may increase a current density at an edge of the emitter, resulting in a conductive modulation effect in the base. Moreover, the edge-crowding effect in the emitter may also cause a reduction of current density in a center region of the emitter, so that the area of the emitter may not be effectively utilized.

SUMMARY OF THE DISCLOSURE

In accordance with the present disclosure, there is provided a method for manufacturing a bipolar transistor. The method comprises forming a first epitaxial layer on a semiconductor substrate, forming a second epitaxial layer on the first epitaxial layer, forming an oxide layer on the second epitaxial layer, etching the oxide layer to form an opening in which the second epitaxial layer is exposed, and forming a third epitaxial layer in the opening. The first and third epitaxial layers have a first-type conductivity, and the second epitaxial layer has a second-type conductivity.

In accordance with the present disclosure, there is also provided a bipolar transistor. The bipolar transistor comprises a semiconductor substrate, a first epitaxial layer formed on the semiconductor substrate, a second epitaxial layer formed on the first epitaxial layer, an oxide layer formed on the second epitaxial layer and having an opening exposing a portion of the second epitaxial layer, and a third epitaxial layer formed in the opening. The first and third epitaxial layers have a first-type conductivity, and the second epitaxial layer has a second-type conductivity, the first-type conductivity being different from the second-type conductivity.

Features and advantages consistent with the present disclosure will be set forth in part in the description which follows, and in part will be obvious from the description, or may be learned by practice of the present disclosure. Such features and advantages will be realized and attained by means of the elements and combinations particularly pointed out in the appended claims.

DESCRIPTION OF THE EMBODIMENTS

Figure 1:
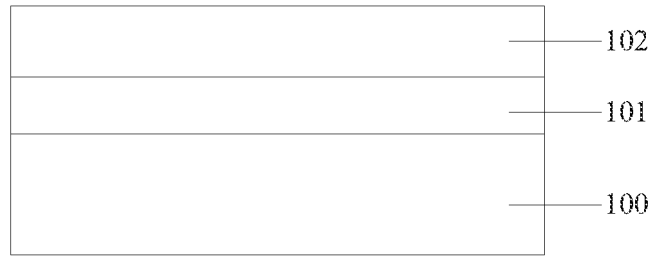
FIGS. 1-3 are schematic cross-sectional views showing a conventional process of manufacturing a vertical NPN transistor.
Figure 2:
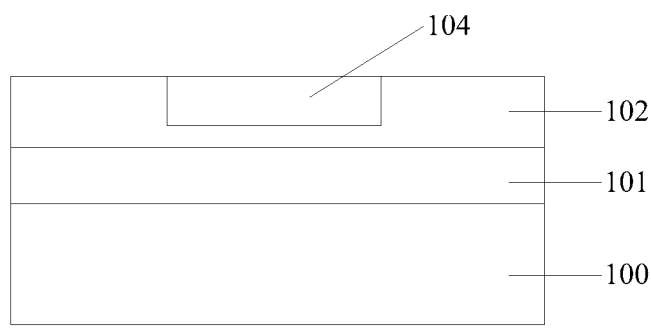
Figure 3:
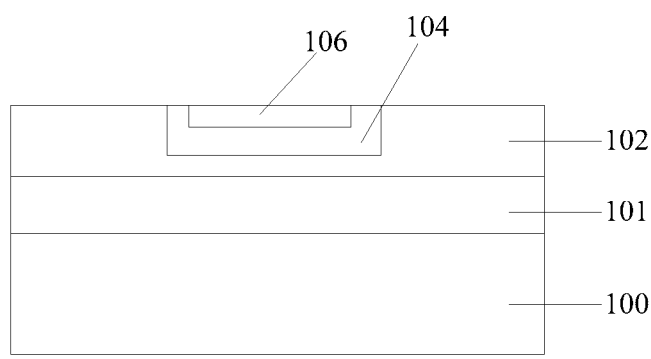
Figure 4:
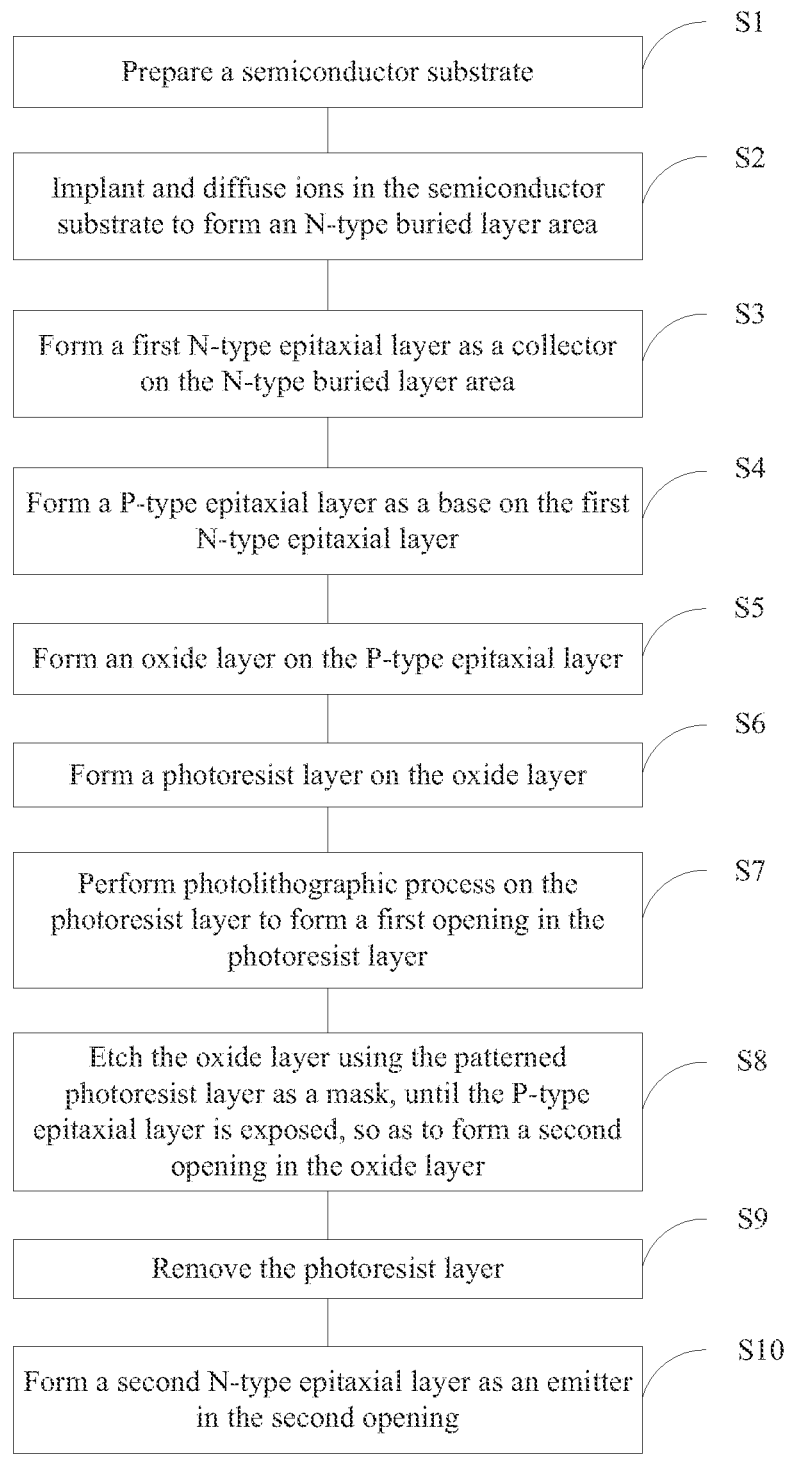
FIG. 4 illustrates a flow chart of a method for manufacturing a vertical NPN transistor according to one embodiment consistent with the present disclosure.

FIG. 4 is a flow chart illustrating a method for manufacturing a vertical NPN transistor according to one embodiment consistent with the present disclosure. The method includes the following steps:

Step S1: preparing a semiconductor substrate.

Step S2: implanting and diffusing ions in the semiconductor substrate to form an N-type buried layer.

Step S3: forming a first N-type epitaxial layer as a collector on the N-type buried layer.

Step S4: forming a P-type epitaxial layer as a base on the first N-type epitaxial layer.

Step S5: forming an oxide layer on the P-type epitaxial layer.

Step S6: forming a photoresist layer on the oxide layer.

Step S7: Patterning the photoresist layer by a photolithographic process to form a first opening in the photoresist layer.

Step S8: etching the oxide layer using the patterned photoresist layer as a mask, until the P-type epitaxial layer is exposed, so as to form a second opening in the oxide layer.

Step S9: removing the photoresist layer.

Step S10: forming a second N-type epitaxial layer as an emitter in the second opening.

Figure 5:
FIGS. 5-7 are schematic cross-sectional views showing a process for manufacturing a bipolar transistor consistent with the present disclosure.
Figure 6:
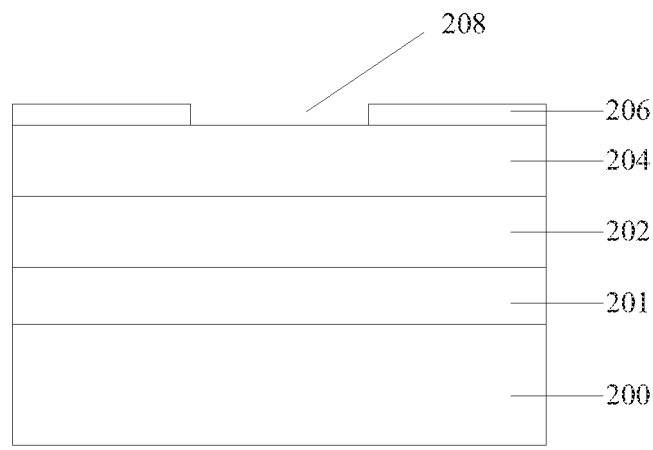
Figure 7:
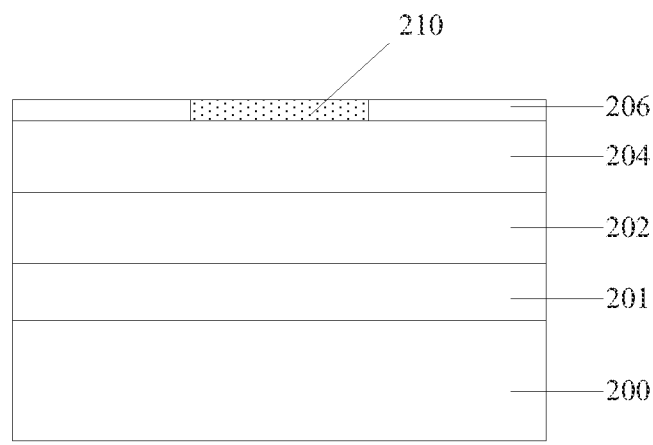

FIGS. 5-7 are schematic cross-sectional views illustrating different stages of the manufacturing method consistent with the present disclosure. As illustrated in FIG. 5, a semiconductor substrate 200 is prepared. The semiconductor substrate 200 may be, for example, a silicon substrate or a silicon germanium substrate. N-type ions are implanted into the semiconductor substrate 200. In some embodiments, the N-type ions may be antimony ions, and the implantation may be performed at a dose in the range from about $5\times10^{14}/cm^2$ to about $8\times10^{14}/cm^2$ and an energy in the range from about 40 Kev to about 80 Kev. In some embodiments, an annealing process may be performed to enhance diffusion of the implanted N-type ions in the semiconductor substrate 200. An N-type buried layer 201 is formed by the N-type ion implantation and diffusion.

After the N-type buried layer 201 is formed, a first N-type epitaxial layer 202 to act as a collector is formed on the N-type buried layer 201. In some embodiments, the N-type epitaxial layer 202 may be formed of for example, a single crystal silicon with a thickness in the range from about 4 μm to about 5 μm. Suitable epitaxial growth methods for forming, the N-type epitaxial layer 202 may include, for example, Atomic Layer Deposition (ALD), Chemical Vapor Deposition (CVD), or Plasma Enhanced Chemical Vapor Deposition (PECVD).

After forming the N-type epitaxial layer 202, a P-type epitaxial layer 204 to act as a base is formed on the N-type epitaxial layer 202. In some embodiments, the P-type epitaxial layer 204 may be formed of, for example, a single crystal silicon with a thickness in the range from about 1 μm to about 3 μm. The P-type epitaxial layer 204 may be formed by, for example, ALD, CVD, or PECVD.

Referring to FIG. 6, an oxide layer 206 is then formed on the P-type epitaxial layer 204. In some embodiments, the oxide layer 206 may be formed of a silicon-containing oxide (e.g., silicon dioxide) with a thickness in the range from about 2500 Å to 3500 Å. In some embodiments, the thickness of the oxide layer 206 may be about 3000 Å. In some embodiments, the oxide layer 206 may be formed by a CVD method or a thermal oxidation method. The oxide layer 206 may prevent single crystal silicon from growing outside an emitter area during subsequent selective epitaxial growth.

A photoresist layer (not shown) is then formed on the oxide layer 206 by, for example, a spin coating method. A photolithographic process, including an exposure process and a development process, is performed to pattern the photoresist layer to define a first opening in the photoresist layer. The oxide layer 206 is then etched using the patterned photoresist layer as an etching mask until the P-type epitaxial layer 204 is exposed, so as to form a second opening 208 in the oxide layer 206. In some embodiments, the oxide layer 206 may be etched by a dry etching method or a wet etching method.

Referring to FIG. 7, a second N-type epitaxial layer 210 is selectively deposited in the second opening 208 to form an emitter. The second N-type epitaxial layer 210 may have a thickness substantially the same as that of the oxide layer 206. In some embodiments, a selective epitaxial method may he used to form the N-type epitaxial layer 210. In some embodiment, after depositing the material for the N-type epitaxial layer 210, a planarization process, such as a chemical-mechanical polishing (CMP) process, may be performed to remove any residual material left on the oxide layer 206.

In some embodiments, a layer containing the material for the N-type epitaxial layer 210 may be deposited both in the second opening 208 and on the oxide layer 206. A planarization process, such as a CMP process, may be performed to remove the material formed on the oxide layer 206 until the oxide layer 206 is exposed.

In some embodiments, after the N-type epitaxial layer 210 is formed, an annealing process may be performed to diffuse the implanted ions uniformly.

A vertical NPN transistor consistent with embodiments of the present disclosure is also illustrated by FIG. 7. The transistor includes: the semiconductor substrate 200; the N-type buried layer 201 formed in the semiconductor substrate 200; the first N-type epitaxial layer 202 as the collector of the vertical NPN transistor formed on the N-type buried layer 201; the P-type epitaxial layer 204 as the base of the vertical NPN transistor formed on the N-type epitaxial layer 202; the oxide layer 206 with an opening formed therein and through the entire thickness of the oxide layer 206, formed on the P-type epitaxial layer 204; and the N-type epitaxial layer 210 formed in the opening in the oxide layer 206 and to act as the emitter of the NPN transistor.

Methods consistent with the present disclosure may also be used to form, for example, a vertical PNP transistor. In accordance with such a method, a semiconductor substrate is prepared first, N-type ions are implanted and diffused in the semiconductor substrate to form an N-type buried layer. A first P-type epitaxial layer is formed as a collector on the N-type buried layer. An N-type epitaxial layer is formed as a base on the first P-type epitaxial layer. An oxide layer is formed on the N-type epitaxial layer. The oxide layer is then patterned and etched until the N-type epitaxial layer is exposed to form an opening in the oxide layer. After that, a second P-type epitaxial layer as an emitter is formed in the opening.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for manufacturing a bipolar transistor, comprising:
   forming a first epitaxial layer on a semiconductor substrate, the first epitaxial layer having a first-type conductivity;
   forming a second epitaxial layer on the first epitaxial layer, the second epitaxial layer having a second-type conductivity;
   forming an oxide layer on the second epitaxial layer;
   partially etching the oxide layer to form an opening in which the second epitaxial layer is exposed; and
   forming a third epitaxial layer in the opening, the third epitaxial layer having the first-type conductivity.

2. The method according to claim 1, further comprising:
   implanting and diffusing ions in the semiconductor substrate to form a buried layer before forming the first epitaxial layer, the buried layer having the first-type conductivity,
   wherein the first epitaxial layer is formed on the buried layer.

3. The method according to claim 2, wherein the implanting and diffusing includes implanting and diffusing N-type ions.

4. The method according to claim 3, wherein the implanting and diffusing includes implanting and diffusing antimony ions.

5. The method according to claim 1, wherein the forming of the first epitaxial layer includes forming an N-type epitaxial layer.

6. The method according to claim 1, wherein the forming of the second epitaxial layer includes forming a P-type epitaxial layer.

7. The method according to claim 1, wherein the forming of the third epitaxial layer includes forming an N-type epitaxial layer.

8. The method according to claim 1, further including providing the semiconductor substrate as a silicon substrate.

9. The method according to claim 1, wherein the forming of the first epitaxial layer includes forming the first epitaxial layer as a single crystal silicon layer having a thickness selected from a range of about 4 μm to about 5 μm.

10. The method according to claim 1, wherein the forming of the second epitaxial layer includes forming the second epitaxial layer as a single crystal silicon layer having a thickness selected from a range of about 1 μm to about 3 μm.

11. The method according to claim 1, wherein the forming of the third epitaxial layer includes forming the third epitaxial layer as a single crystal silicon layer having a thickness selected from a range of about 2 μm to about 3 μm.

12. The method according to claim 1, wherein the forming of the oxide layer includes forming the oxide layer as a silicon-containing oxide layer having a thickness selected from a range of about 2500 Å to about 3500 Å.

13. The method according to claim 1, wherein the forming of the third epitaxial layer includes forming the third epitaxial layer with a thickness substantially the same as a thickness of the oxide layer.

14. The method according to claim 1, wherein the forming of the oxide layer includes forming the oxide layer by a chemical vapor deposition method or a thermal oxide method.

15. The method according to claim 1, wherein the forming of the third epitaxial layer includes thrilling the third epitaxial layer by a selective epitaxial method.

16. The method according to claim 1, wherein forming the third epitaxial layer includes:
   forming an epitaxial layer in the opening and over the oxide layer, and
   removing a portion of the epitaxial layer formed over the oxide layer by a planarization process.

17. The method according to claim 2, wherein the implanting and diffusing includes implanting and diffusing P-type ions.

18. The method according to claim 1, wherein the forming of the first epitaxial layer includes forming a P-type epitaxial layer.

19. The method according to claim 1, wherein the forming of the second epitaxial layer includes forming an N-type epitaxial layer.

20. The method according to claim 1, wherein the forming of the epitaxial layer includes forming a P-type epitaxial layer.

21. A bipolar transistor, comprising:
   a semiconductor substrate;
   a first epitaxial layer formed on the semiconductor substrate, the first epitaxial layer having a first-type conductivity;
   a second epitaxial layer formed on the first epitaxial layer, the second epitaxial layer having a second-type conductivity, the second-type conductivity being different than the first-type conductivity;
   an oxide layer formed on the second epitaxial layer, the oxide layer having an opening exposing a portion of the second epitaxial layer; and
   a third epitaxial layer formed in the opening, the third epitaxial layer having the first-type conductivity.

22. The bipolar transistor according to claim 21, further comprising:
   a buried layer formed in the semiconductor substrate, the buried layer having the first-type conductivity,
   wherein the first epitaxial layer is formed on the buried layer.

* * * * *